(12) United States Patent
Richter et al.

(10) Patent No.: US 6,779,136 B2
(45) Date of Patent: Aug. 17, 2004

(54) METHOD FOR TESTING THE REFRESH DEVICE OF AN INFORMATION MEMORY

(75) Inventors: Detlev Richter, München (DE); Wolfgang Spirkl, Germering (DE)

(73) Assignee: Infineon Technologies AG, Munich (DE)

(*) Notice: Subject to any disclaimer, the term of this patent is extended or adjusted under 35 U.S.C. 154(b) by 590 days.

(21) Appl. No.: 09/776,947

(22) Filed: Feb. 5, 2001

(65) Prior Publication Data

US 2001/0027541 A1 Oct. 4, 2001

(30) Foreign Application Priority Data

Feb. 4, 2000 (DE) .......................................... 100 04 958

(51) Int. Cl.[7] .............................................. G06F 11/00
(52) U.S. Cl. .......................... 714/42; 714/30; 714/719; 365/222
(58) Field of Search .......................... 714/30, 42, 720, 714/719; 365/201, 222

(56) References Cited

U.S. PATENT DOCUMENTS

| 4,347,589 | A | * | 8/1982 | Proebsting | ............. 365/189.08 |
| 4,672,583 | A | * | 6/1987 | Nakaizumi | ................... 365/222 |
| 5,321,661 | A | * | 6/1994 | Iwakiri et al. | .............. 365/222 |
| 5,335,202 | A | * | 8/1994 | Manning et al. | ............ 365/222 |
| 5,625,597 | A | * | 4/1997 | Hirose | ........................ 365/201 |
| 6,094,389 | A | * | 7/2000 | Ahn | ............................ 365/201 |
| 6,317,852 | B1 | * | 11/2001 | Lau et al. | ................... 714/720 |
| 6,330,696 | B1 | * | 12/2001 | Zorian et al. | ................ 714/720 |
| 6,338,154 | B2 | * | 1/2002 | Kim | ............................ 714/743 |
| 6,452,859 | B1 | * | 9/2002 | Shimano et al. | ....... 365/230.06 |
| 6,522,586 | B2 | * | 2/2003 | Wong | .................... 365/185.25 |
| 6,529,407 | B2 | * | 3/2003 | Shukuri | ................. 365/185.07 |

FOREIGN PATENT DOCUMENTS

EP          0 019 150 A1       11/1980

* cited by examiner

*Primary Examiner*—Scott Baderman
*Assistant Examiner*—Joshua Lohn
(74) *Attorney, Agent, or Firm*—Laurence A. Greenberg; Werner H. Stemer; Gregory L. Mayback

(57) ABSTRACT

A method for testing the refresh device of an information memory contains the following: a refresh selector for selecting memory cells to be refreshed; a sensor for sensing the state of each cell selected by the selector and a restorer for setting each selected cell into a fresh state, which, in a refresh operating mode of the restorer which effects the refreshing, represents the information derived from the sensed state. According to the invention, at the beginning of the test, the states of the cells that are to participate in the test are verified and before the elapsing of the guaranteed minimum retention time of the memory cells after this verification, the restorer is operated in a test operating mode in which the fresh state that it is to set for each participating cell is in each case a predetermined state which differs perceptively from the previously verified state. A check is subsequently made to determine whether the states of the participating cells set by this operation of the restorer correspond to the predetermined states.

10 Claims, 1 Drawing Sheet

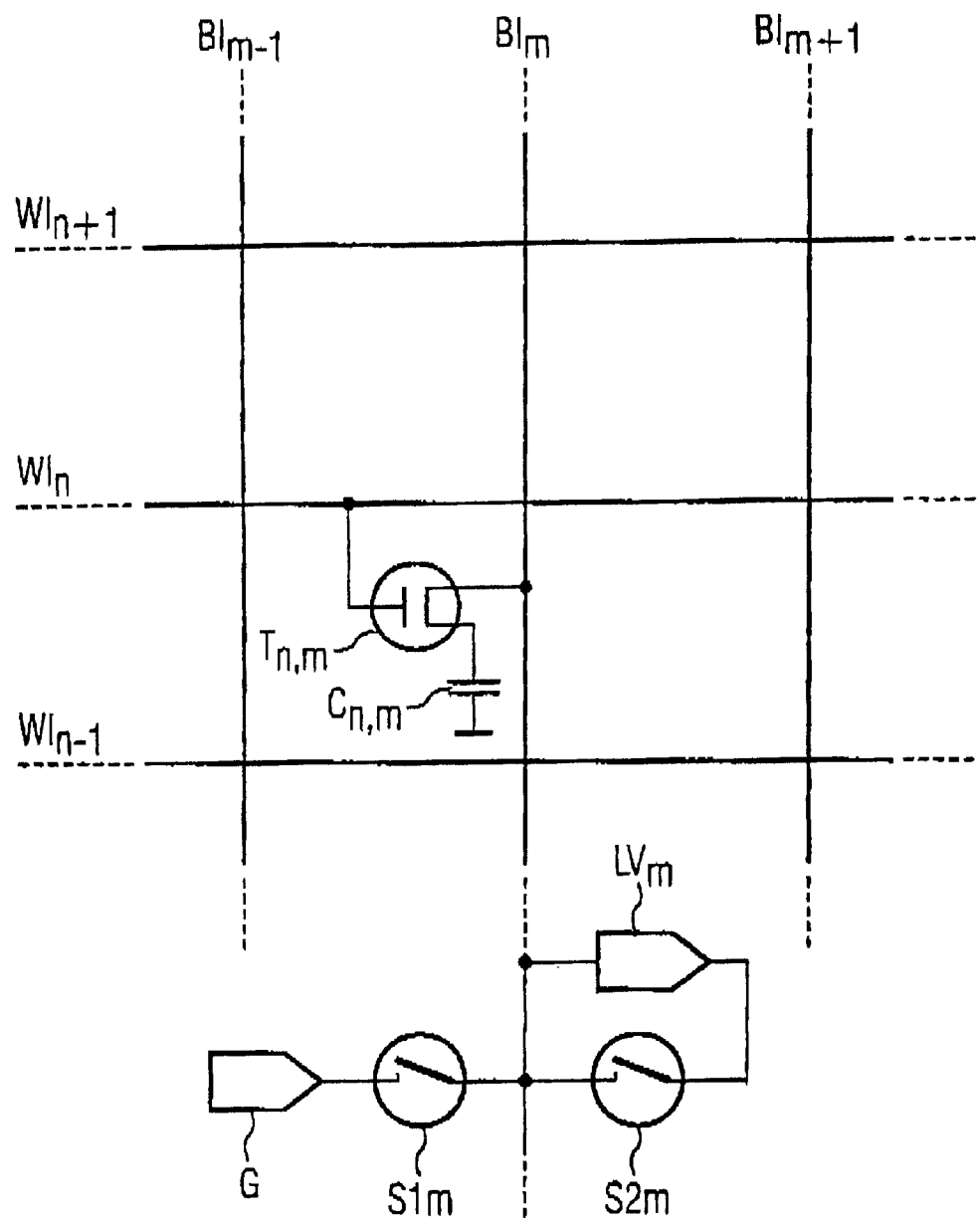

METHOD FOR TESTING THE REFRESH DEVICE OF AN INFORMATION MEMORY

BACKGROUND OF THE INVENTION

Field of the Invention

The present invention generally relates to information memories that require a refresh device in order to refresh at certain time intervals the information that is held in the memory cells. The invention specifically relates to a method for testing such a refresh device of an information memory that is designed to refresh the information stored in a multiplicity of cells of the memory as a state of the respective cell, in each case before a guaranteed minimum retention time has elapsed. The refresh device includes a refresh selector for selecting memory cells to be refreshed; a sensing device for sensing the state of each cell selected by the selector; a restorer for setting each selected cell into a fresh state, which, in a refresh operating mode of the restorer that effects the refreshing, represents the information derived from the sensed state. An important, but not exclusive, application of the invention is DRAMs (Dynamic Random Access Memories), i.e. dynamic memories with direct access, in particular semiconductor memories of this generic type.

The extent to which a cell state that has been imprinted by the writing of an information item remains stable depends on the nature of the memory cells used in an information memory. If the cells include bistable electrical circuits (flip-flops), then the information that has been written is preserved as long as the power supply is not interrupted. However, certain memory cells of a different type are configured in such a way that in the course of time they lose the information that has been written, and therefore have to be "refreshed" from time to time.

This applies for example to memory cells in which the actual memory element is an electrical capacitance (capacitor) with different possible charge states, an information item that has been written being represented by the level of the charge. On account of inevitable leakage of the capacitor, the introduced charge volatilizes in the course of time to such an extent that an information item represented by introduced charge no longer can be unambiguously identified. The cell state can then be interpreted incorrectly during reading. If the cells are operated as binary memories, by a distinction being made only between the two cell states "charged" (high or H level) and "discharged" (low or L level), for the representation of the binary values "1" and "0", then after a certain time the charge of a cell which has had "1" written to it may have decayed to such an extent that a "0" is read at this cell. Quite similar problems arise to an even more pronounced degree if the cells are each used to store more than two discrete information values, by a number of information values being assigned to specific intermediate levels of the charge.

In addition to the capacitive memory cells mentioned above, other kinds of memory cells may also require refreshing. In general, the invention applies to all types of memory cells in which at least one of the information-describing states is volatile. In this case, these states may be of an arbitrary physical or chemical nature.

In principle, a refresh includes the following: the cell state is sensed in good time before it might have volatilized so far that the information represented by it could no longer be unambiguously identified; after, the information identified by the sensed cell state is written afresh to the relevant cell.

The period for which an information item can be retained in a cell, i.e. the "retention time" for which the information item that has been written remains unambiguously identifiable in the cell, is dictated by construction and can differ greatly from cell to cell within the same memory module. In commercially available DRAMs effecting capacitive storage, the guaranteed minimum retention time of a "1" (that is to say of the information described by the H level) is usually a few milliseconds, whereas the actual retention time of the "1" may randomly be much longer in some cells, in many cases even up to a few seconds. When choosing the time intervals for the refresh, however, it is necessary, just for organizational reasons, to comply with the guaranteed minimum retention time, i.e. the intervals between the refreshes must not be longer than this period of time.

An information memory whose cells are in need of the refresh requires and uses, as is known, a refresh device having the following constituents: a refresh selector for selecting memory cells to be refreshed; a sensor for sensing the state of each cell selected by the refresh selector; a restorer for setting each selected cell into a fresh state. The refresh device constructed in this way is normally operated automatically in such a way that the selector selects all the memory cells in accordance with a sequential program set by the user, that the sensor senses the state of each selected cell, and that the restorer sets the relevant cell afresh into that state which corresponds to the information derived from the sensed state. The aforementioned sequential program of the refresh selector must be configured by the user such that no cell remains unrefreshed for longer than the guaranteed minimum retention time of the memory.

In the course of the design analysis and in the production test, a check must be made to determine whether the refresh device can carry out the desired refresh reliably and at all of the cells which are to be selected. A possible malfunction may be that the refresh selector does not correctly follow the set program. This can happen in particular when, in the selector, a cyclically operated refresh counter is used for the cyclically repeated selection of the addresses of the cells or cell groups to be refreshed and the overflow function of said counter does not work correctly or the counter stutters in another way. Another malfunction may occur when a cell that is selected for sensing is not reached by the restorer.

A method for testing the refresh device is insufficient if it only includes the following: writing a known information item tending toward volatility to the entire cell array, then completing a refresh cycle over all the cells shortly before the minimum retention time has elapsed, and subsequently verifying whether all the cells still contain the information that was written. This method is insufficient because those cells whose actual retention time is distinctly longer than the minimum retention time may, at the instant of verification, have retained their information even if they were passed over in the refresh cycle.

In order to yield a really meaningful test result, it is customary, therefore, to write the information and then to carry out many successive refresh cycles, at intervals of in each case not longer than the minimum retention time, but in total for a duration which is longer than the maximum retention time to be expected only in this way is it possible, using the subsequently sensed information content of the cells, to ascertain whether and which cells were regularly passed over during the refresh cycles. However, this method requires long test times and is ruled out, therefore, in particular when the tests, in the case of a relatively large memory, ought to be carried out only in sections on small memory blocks.

As an alternative, instead of checking the refresh result itself, the mode of operation of the refresh counter might just be checked. However, this does not allow identification of many defect states, such as, for instance, the lack of actually being able to reach a selected cell. A defect for example in the wiring between the refresh counter and the address decoder would remain unnoticed, as would a defect in the multiplexer which is usually provided for selection between normal address and refresh address. Moreover, a counter check requires the detection of the respectively existing count status (instantaneous count) in order to be able to ascertain any defects in the operation of the counter. In many refresh counters, displays indicating the counter reading or a defined reset state are not provided, so that in these cases additional detection hardware is needed for the test, e.g. a special scan chain.

SUMMARY OF THE INVENTION

It is accordingly an object of the invention to provide a method for testing the refresh device of an information memory that overcomes the hereinafore-mentioned disadvantages of the heretofore-known devices of this general type and that tests the refresh device of an information memory and yields statements in a short test time that can be used to ascertain whether all the constituents of the refresh device are operating in accordance with the specifications.

With the foregoing and other objects in view, there is provided, in accordance with the invention, a method for testing a refresh device of an information memory is provided. The information memory has a multiplicity of cells. Each cell of the multiplicity of cells has a minimum retention time and storing information as a state of the respective cell. The refresh device is designed to refresh the information stored in each cell of the multiplicity of cells before the guaranteed minimum retention time has elapsed. According to the method, the first step is providing a refresh selector for selecting a cell to be refreshed from a multiplicity of cells. The next step is providing a sensor for sensing a state of each cell selected by the refresh selector. The next step is providing a restorer for setting each selected cell into a fresh state when in a refresh operating mode. The restorer refreshes and represents the information derived from the sensed state, and has a test operating mode. The next step is verifying the respective states of each of the selected cells to produce a verified state for each cell. The next step is setting the fresh state for each selected cell to a predetermined state that differs perceptively from the previously verified state with the restorer operating in the test operating mode before the elapsing of the guaranteed minimum retention time. The next step is checking whether the states of the selected cells set in the test operating mode of the restorer correspond to the predetermined states.

In accordance with another feature of the invention, the verification includes writing a known information item to each selected cell.

In accordance with another feature of the invention, the known information item forces all of the participating cells to assume the same state when the known information is written. In addition, the fresh state predetermined in the test operating mode of the restorer is identical for all of the participating cells.

In accordance with another feature of the invention, a total range of possible states is defined. And, the fresh state predetermined in the test operating mode of the restorer differs perceptively from the verified state, anywhere within the total range of possible states.

In accordance with another feature of the invention, a number N of cell groups of the memory is being refreshed. Each cell group contains at least one memory cell. The selector contains a refresh address counter with a counting range of N counts, and a refresh clock periodically emitting refresh clock pulses advancing the refresh address counter cyclically. Each of the N cell groups have an address addressable by the refresh counter. The next step that is applied to the underlying the method includes choosing a cell group. The next step is writing a known information item at the address of a chosen cell group. The next step is applying a number X of refresh clock pulses with the restorer being operated in the test operating mode before the guaranteed minimum retention time has elapsed. The next step is checking whether the state of the chosen cell group set by the operation of the restorer corresponds to the predetermined states after X refresh clock pulses have been applied.

In accordance with another feature of the invention, X=N; and the method includes applying a number Y of refresh clock pulses with the restorer in the refresh operating mode. Y is a number other than an integer multiple of N. Once these steps are completed, the following can be repeated. The first repeated step is writing a known information item at the address of a chosen cell within each of the N elements of the set which can be addressed by the refresh counter. The next repeated step is applying a number X of refresh clock pulses with the restorer being operated in the test operating mode before the guaranteed minimum retention time has elapsed. The next repeated step is checking whether the states of the chosen cells set by the operation of the restorer corresponds to the predetermined states after the application of the X refresh clock pulses.

In accordance with another feature of the invention, Y equals N/2.

In accordance with another feature of the invention, the method includes the following additional steps. The first step is presetting a defined count with X<N at the refresh counter; an alternative is identifying instantaneously the existing count with X<N. The next step is writing a known information item at the address of a chosen cell within each of the N. The next step is applying a number X of refresh clock pulses to the chosen cell group with the restorer being operated in the test operating mode before the guaranteed minimum retention time has elapsed. The next step is checking whether the states of the chosen cells set by the operation of the restorer corresponds to the predetermined states after the application of the X refresh clock pulses. The next step is writing a known information item at the address of a chosen cell within each of the N elements of the set which can be addressed by the refresh counter. The next step is applying a number N−X+1 of refresh clock pulses with the restorer being operated in the test operating mode before the guaranteed minimum retention time has elapsed. The next step is checking whether the states of the chosen cells set by the operation of the restorer corresponds to the predetermined states after the application of the N−X+1 refresh clock pulses.

In accordance with another feature of the invention, X equals N−1.

In accordance with another feature of the invention, an assigned amplifier reads the information stored in the cell. A signal source produces an output signal that leads to the information stored in the cell being read into the assigned sense amplifier. And, the restorer contains a switch. The switch accesses the respectively selected cell in the refresh operating mode to allow the output signal of the signal source to become active at the cell, and then, once this signal has been decoupled, to couple the output of the sense amplifier to the cell for rewriting the information that was read. The method with applied with this arrangement includes in the refresh operating mode setting the output signal of the signal source to a value that leads to the production of the cell state predetermined for the test operating mode when the selected cell is accessed. The next step is coupling the output signal of the signal source to the cell with the switch for the duration of the access, while decoupling the output of the sense amplifier from the cell.

With the objects of the invention in view, there is also provided a method for testing a refresh device of an information memory. The refresh device refreshes the information stored in a multiplicity of cells of the information memory as a state of each respective cell before a guaranteed minimum retention time has elapsed. The restore includes a switch. Each cell has a bit line. The method includes providing a refresh selector for selecting memory cells to be refreshed. The next step is providing a sensor sensing the state of each cell selected by the selector. The next step is providing a restorer for setting each selected cell into a fresh state, which, in a refresh operating mode of the restorer that effects the refreshing, represents the information derived from the sensed state. The next step is verifying the states of the cells that are to participate in the test at the beginning of the test. The next step is operating the restorer in a test operating mode in which a fresh state that it is to be set for each participating cell is in each case a predetermined state that differs perceptively from the previously verified state before the guaranteed minimum retention time elapses after this verification. The next step is checking whether the states of the participating cells set by this operation of the restorer correspond to the predetermined states. The next step is accessing the respectively selected cell with the switch in the refresh operating mode. The next step is precharging the bit line of the cell with an output signal of a signal source. The next step is decoupling the signal source. The next step is reading out the information item which is stored in the cell into an assigned sense amplifier by driving the associated word line, which subsequently couples the output of the sense amplifier to the cell for the purpose of rewriting the information that was read. The next step is setting the output signal of the signal source to a value during the refresh operating mode which when the selected cell is accessed, produces a cell state which is predetermined for the test operating mode. The next step is coupling the output signal of the signal source to the cell with the switch during precharging, while decoupling the output of the sense amplifier from the cell.

As the basic principle, the test method according to the invention includes the following steps:

that, at the beginning of the test, the states of the cells that are to participate in the test are verified;
that, before the elapsing of the guaranteed minimum retention time after this verification, the restorer is operated in a test operating mode in which the fresh state that it is to set for each participating cell is in each case a predetermined state which differs perceptively from the previously verified state;
that a check is made to determine whether the states of the participating cells set by this operation of the restorer correspond to the predetermined states.

The invention is fundamentally based on two insights. One insight is that the abovementioned problems during refresh tests ultimately stem from the fact that the intended operation of the restorer includes the job of restoring in the respectively selected cell an information item which is the same as the previously sensed information item. Secondly, it was recognized that a deliberate departure from this intended operation, namely a test operating mode with the job of restoring an unambiguously different information item from the one sensed, can reveal practically all possible defects in all the constituents of the refresh device. In other words, any defect that would or might adversely affect the success of a genuine refresh operation also manifests itself discernibly in the result of said test operating mode of the restorer. Thus, the test operating mode according to the invention circumvents the abovementioned problems, and the test result nevertheless retains unrestricted meaningfulness.

The verification of cell states, which takes place at the beginning of the test, may consist in sensing the states of the affected cells, if they are still unknown, e.g. by normal read-out of the information stored therein. Alternatively, the verification may be effected by writing to the cells some known information item by means of a normal writing operation (so that the reading is superfluous).

This known information item need not be identical for all of the affected cells, but it is preferably identical, so that all these cells assume the same known state. This has the advantage that the cell states that are subsequently to be set in the test operating mode of the restorer can also be identical to one another, which simplifies this operation and also the subsequent evaluation. All that needs to be fed into the restorer at a suitable location (where the level which describes the information of the previous cell state is otherwise present) is some defined fixed level which leads to a cell state which can be distinguished from the written state. This new ("fresh") cell state need not even unambiguously describe a memory information item; it may also be some intermediate state. Preferably, however, in order to facilitate the evaluation, the cell state to be newly set is assigned to one of the possible memory information items, for instance a "1", in the case of binary memory cells, if the previously written information item is a "0".

In this specific embodiment, after a cycle which has been performed in the test operating mode of the restorer, all the affected memory cells contain a "1" if the refresh device is free from defects. If a "0" appears somewhere, it can be concluded that the refresh device has a malfunction with regard to the relevant cell (or cell group).

As already mentioned further above, refresh selectors often contain a refresh counter which can be advanced by refresh clock pulses cyclically over a respective counting range encompassing N counts (0 to N−1) in order to address a set of N cells or cell groups of the memory in cyclic repetition for the refresh. In these cases, the test method according to the invention is preferably carried out in such a way that after a known information item has been written to the cells that are to participate in the test, and before the minimum retention time has elapsed, the refresh counter is advanced by successive clock pulses, with the restorer being operated in the test operating mode, in order to set the successively addressed cells into the "new" states which are predetermined by this operating mode. Afterward, a check is made to determine the extent to which these new states have actually been reached.

If this test has been carried out over exactly N clock pulses, it should be assumed that all N addresses $W_0$ to $W_{N-1}$ for the N elements of the set of cells or cell groups that is to participate have been traversed. However, this assumption would be justified only if the counter and the decoder that translates the count into the respectively assigned address operate correctly. If this ideal condition is met, then a test cycle with exactly N clock pulses reveals whether, for each address generated, the respectively assigned element of the set was actually reached by the restorer. In other words, a simple test with N clock pulses is only expedient if it can be trusted that counter and decoder are free from defects.

By contrast, if it cannot be trusted that this ideal situation is the case, the method according to the invention is preferably carried out using a particular strategy so that possible defects which can occur during refresh address generation likewise can be taken into account or even identified. Such defects may be:

i. the counter skips counts or temporarily falters over one or more pulses;
ii. the overflow of the counter (i.e. the return from the end to the start of the counting range) does not function correctly, for instance by an additional clock pulse being used up in the process;
iii. the count decoder for address generation does not function correctly nor has no connection to the counter output;
iv. a changeover switch (multiplexer) which may be present and serves for selection between normal address and refresh address is defective.

In the worst-case situation, when there are no means for indicating the count or for presetting a defined count (for instance for targeted resetting to 0) at the counter, the following test sequence is preferably realized: firstly, all N elements (cells or cell groups) to be selected from the set participating in the test are set by normal writing into a known state (for example to L levels). Then, within the minimum retention time and with the restorer being operated in the test operating mode, N successive clock pulses are applied to the refresh counter, and the "new" states of the N elements are read out. Afterward, again within the minimum retention time but with the restorer being operated in the refresh operating mode, a number Y of clock pulses are applied to the counter, where Y is some number other than an integer multiple of N (Y=N/2 is preferably chosen). Then, all N elements to be selected are once again set into a known state, and once again within the minimum retention time, this time with the restorer once again being operated in the test operating mode, N successive clock pulses are applied to the refresh counter, and the resulting states of the N elements are read out.

If all parts of the refresh device are free from defects, the two read-out processes in all N elements in each case exhibit the cell states that are predetermined by the restorer. The interposition of the Y genuine refresh operations is intended to guarantee that at least one of the two N-part test cycles comprises an overflow of the refresh counter, so that any overflow defects are manifested in the test result. In other words, it is ensured that an overflow is stepped through during the second test cycle, if this did not take place during the first test cycle. The number Y=N/2 is preferably chosen because it is the smallest of those numbers which are the farthest possible from integer multiples (including 0) of N. Thus, even in the event of any skipping and faltering during operation of the counter, there is optimal probability that the overflow will be stepped through within one or other of the test cycles.

In the case of the test sequence described above, a total of 2N+N/2 clock pulses are required for the test. Taken together, the two read-out processes give information about whether the restorer, in principle, reaches each of the N elements and whether the overflow function of the counter is operating correctly. By way of example, if, before each of the two test cycles, the binary state "0" is written at all N elements (e.g. L levels) and the state which is predetermined by the restorer describes a "1" (H levels), then each of the two read-out processes exhibits the binary state "1" (H level) at all of the elements if all parts operate in a manner free from defects. Where a "0" is read out instead of the expected "1", the refresh device has a malfunction.

If means for indicating the count status or for presetting a defined count are provided on the counter, then the test sequence can be shortened relative to the case described above. Firstly, the count status of the refresh counter is verified, i.e. read or set to a known count A (e.g. 0), and all N elements (cells or cell groups) to be selected from the set participating in the test are set by normal writing into a known state (for example all to L levels). Then, within the minimum retention time and with the restorer being operated in the test operating mode, X<N successive clock pulses are applied to the refresh counter, and afterward the states of all N elements are read out for the first time. Afterward, all N elements to be selected are again set into a known state (e.g. all to L levels). Then, within the minimum retention time and with the restorer being operated in the test operating mode, N−X+1 successive clock pulses are applied to the refresh counter, and afterward the states of all N elements are read out for the second time.

Depending on whether the number A+X is less than or greater than N, the overflow of the counter is stepped through during the second or during the first test cycle. If all parts of the refresh device operate in a manner free from defects, the following situations arise:

1) in the first case (that is to say A+X<N),
   1a) the first read-out process exhibits the state which was predetermined by the restorer in the test operating mode at the addresses $W_A$ to $W_{A+X-1}$, and the state which was in each case verified beforehand at the remaining addresses, and
   1b) the second read-out process exhibits the state that was predetermined by the restorer in the test operating mode at the addresses $W_{A+X}$ to $W_{N-1}$ and from $W_0$ to $W_A$, and the state which was in each case verified beforehand at the remaining addresses.
2) In the second case (that is to say A+X>N)
   2a) the first read-out process exhibits the state which was predetermined by the restorer in the test operating mode at the addresses $W_A$ to $W_{N-1}$ and at the addresses $W_0$ to $W_{A+X-N-1}$, and the state which was in each case verified beforehand at the remaining addresses, and
   2b) the second read-out process exhibits the state that was predetermined by the restorer in the test operating mode at the addressees $W_{A+X-N}$ to $W_A$, and the state which was in each case verified beforehand at remaining addresses.

In these test sequences, a total of just N+1 clock pulses are required for the test. Taken together, both read-out processes show whether the restorer, in principle, reaches all of the elements. The read-out process after that test cycle in which the overflow of the counter was stepped through shows whether the overflow function is operating correctly.

If the entire system is designed in such a way that upon each reset (e.g. upon the initialization of the system), the refresh counter is set to 0 in a defined manner, then this count status, that is to say A=0, can also be taken as a basis at the beginning of the test sequence. As an example, suppose that X=N−1 and that, before each of the two test cycles, the binary state "0" is written at all N elements (e.g. L levels), and that the state which is predetermined by the restorer represents a "1" (H level). In this case, with defect-free operation, the first read-out process exhibits the binary state "1" (H level) at the addresses $W_0$ to $W_{N-2}$ and the binary state "0" (L level) at the address $W_{N-1}$; the second read-out process exhibits the binary state "1" at the addresses $W_{N-1}$ and $W_0$ and the binary state "0" (L level) at the addresses $W_1$ to $W_{N-2}$. Where a "0" is read out instead of an expected "1", it can be concluded that the refresh device has a malfunction.

During the second test cycle, it is also possible for more than N−X+1 clock pulses to be applied. However, a number of exactly N−X+1 generally suffices for reliably identifying skipping or faltering during operation of the refresh counter over the extent of 1 clock pulse.

In customary DRAM memories having an array of N rows and M columns of memory cells (usually M=N), in each case a whole row (M cells) is selected for the refresh during normal operation by the refresh counter, by selective opening of the relevant row address line ("word lines"), while all the column address lines ("bit lines") are open. Thus, given the presence of N rows with the word line addresses $W_0$ to $W_{N-1}$, each of the N "elements" of the set to be selected by the refresh counter contains M cells in each case. In order to test whether the addressing by the refresh counter is functioning properly, it may suffice, in the method according to the invention, in the course of the test cycles, to observe in each case only one of these cells in each row, in that, during the verification of cell states before the test (e.g. during writing) and during the checking of the cell states after the test (that is to say during read-out), only one and in each case the same column address is selected.

In memory modules, the memory is often divided into a plurality of banks, i.e. into regions of word lines, so that one word line can be open at the same time in each bank. It follows from this for the refresh operation that it is possible, in principle, to simultaneously refresh cells on b word lines, if b is the number of banks.

If a dedicated refresh counter is provided for each bank, then the refresh tests according to the invention can be carried out unchanged for each bank, to be precise in parallel or serially. Otherwise, if a single counter is present for b banks, a complex behavior results. Only the selected banks are refreshed, but the common counter increments upon each refresh operation. By way of example, if two banks A and B (b=2) each with N word lines are refreshed alternately, starting with bank A, then, after N refresh events, each word line having an odd ordinal number is refreshed in A and each word line having an even ordinal number is refreshed in B. This behavior can also be checked using the refresh test method according to the invention, by appropriately extending the test patterns described above. Specifically, using the cell states which are read out in each case after a refresh device test operating mode according to the invention, it is possible to identify malfunctions of the refresh device during parallel refreshing, during serial refreshing and during refreshing according to a mixed pattern, if the test pattern is extended appropriately.

In order to complete the test method according to the invention, practically no additional hardware is necessary on the refresh device to be tested. The only modification that has to be made is to provide a possibility of changing over between the normal refresh operating mode and the test operating mode of the restorer. It is the case in particular if, in a preferred embodiment of the invention, the cell states are verified before the test operation by the same information item in each case, such as the L level for instance, being written to all the participating cells, that the changeover to the test operating mode is extremely simple: all that is necessary is for a single level (e.g. the H level) which can be distinguished from the L level to be provided and placed at the output of the restorer at a given time in each case.

In conventional semiconductor DRAMs with binary capacitive storage, a transistor switch is used as the restorer. This switch is present in the sense amplifier and, during the reading of a cell information item, enters a switching state in which its "output electrode" is at the level that indicates the information read. During normal reading operation, directly after the reading process, with the word line (row address line) still open, a connection from said electrode to the relevant bit line (column address line) is momentarily maintained, with the result that the information read is written back to the relevant cell. The same process takes place during normal refresh operation, which is fundamentally nothing more than a reading operation (but without further processing of the output signal of the sense amplifier). In order to realize the test operating mode according to the invention, it suffices to drive said transistor switch externally, or impress on its output electrode or on the relevant bit line a potential, such that the cell state which is predetermined for the test operating mode is produced during rewriting.

Other features which are considered as characteristic for the invention are set forth in the appended claims.

Although the invention is illustrated and described herein as embodied in a method for testing the refresh device of an information memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole FIGURE of the drawings is a schematic showing a detail from a DRAM memory module with capacitive storage.

DESCRIPTION OF THE PREFERRED EMBODIMENTS

Referring now to the single FIGURE of the drawing, a memory cell is illustrated. The memory cell can be addressed via a word line $WL_n$ (row address line) and a bit line $BL_m$ (column address line). The cell includes the storage capacitor $C_{n,m}$, one of whose ends is connected to reference-ground potential ("ground") and the other end of which is through-connected to the bit line $BL_m$ via the channel of an associated memory cell transistor ("selection transistor") $T_{n,m}$, when the word line $WL_n$ connected to the gate electrode of the transistor $T_{n,m}$ is driven. The memory module, of course, contains a multiplicity of further identical cells that form an array of rows and columns. Each row is assigned an individual word line and each column is assigned an individual bit line. The FIGURE shows, besides the word line $WL_n$, only the respective immediately adjacent exemplars $WL_{n-1}$, $WL_{n+1}$ and, besides the bit line $BL_m$, only the respective immediately adjacent exemplars $BL_{m-1}$, $BL_{m+1}$. Each bit line (or each bit line pair in the case of paired or bipartite bit lines) is connected to an assigned read/write circuit including a sense amplifier for sensing the charge state of the storage capacitor and a switch system for charging the storage capacitor to selected voltage levels. The operation of such a circuit for normal writing and reading of the memory information (and also for restoring the information after reading) is generally known and need not be explained here. The figure shows only parts of the circuit connected to a bit line ($BL_m$), to the extent useful for explaining the normal refresh operation and the test operation according to the invention. For simplification, this explanation below will discuss in each case a single bit line instead of the conventional bit line pairs.

A customary refresh operation on some cell, for example on the illustrated cell with the storage capacitor $C_{n,m}$, proceeds as follows:

Step 1: the relevant bit line starts (exactly as in the case of the normal reading process) in the "precharged" state at a voltage level $V_1$ provided by a generator G. For this purpose, a precharge switch $S1_m$ between the generator G and the bit line $BL_m$ is closed.

Step 2: The switch $S1_m$ is now opened. Then, by driving the word line $WL_n$, the selection transistor $T_{n,m}$ is turned on and the storage capacitor $C_{n,m}$ is thus connected to the bit line $BL_m$. If the low level (L level) VL, that is to say the binary value "0", is stored in the cell, then the bit line voltage is set at a level $V_1$–dV. If the high level (H level) VH, that is to say the binary value "1", is stored in the cell, then the bit line voltage is set at a level $V_1$+dV. The precharge level $V_1$=(VL+VH)/2 is typically chosen.

Step 3: The difference between the existing bit line voltage and the precharge voltage $V_1$ is amplified in the sense amplifier $LV_m$. A recharging switch $S2_m$ which is arranged between the output of the sense amplifier $LV_m$ and the bit line $BL_m$ and has been open until then is closed and, as a result, the amplified difference value is written back to the storage capacitor $C_{n,m}$ via the bit line $BL_m$ and the selection transistor $T_{n,m}$, which is still held in the on state. As a result, the "refreshed" memory level is again available in the storage capacitor.

Step 4: As a result of deenergization of the word line $WL_n$ and the resulting turning-off of the selection transistor $T_{n,m}$, the storage capacitor $C_{n,m}$ is disconnected from the bit line $BL_m$, and, as a result of closing of the precharge switch $S1_m$ and opening of the recharging switch $S2_m$, the bit line $BL_m$ is brought back to the precharge voltage $V_1$ (=step 1).

Continuation: Steps 1 to 4 are repeated for the word line selected next, e.g. for the word line $WL_{m+1}$ for refreshing the storage capacitor $C_{n+1,m}$ (not shown)

In practice, it is customary for all the cells of a row to be refreshed simultaneously by all the bit lines being driven simultaneously in accordance with steps 1 to 4 described above.

Using the elements illustrated in the figure of the drawing, the refresh test according to the invention can also be carried out in a simple manner, without the addition of further hardware components. This is because it is readily possible to change the driving of the bit lines in such a way that, instead of the output voltage of the sense amplifier $LV_m$, the output voltage $V_1$ of the generator G is written directly to the cells. For this purpose, it suffices to carry out steps 1 to 4 in the above-described sequence, with the single modification that the precharge switch $S1_m$ is always closed (in the on state) and the recharging switch $S2_m$ is always open (that is to say never in the on state). Each instance of driving the word line $WL_n$ then becomes a write access for the selected word line, the information written being dictated by the output voltage $V_1$ of the generator G.

In order to realize the test operating mode according to the invention, the step sequence thus modified is carried out for each selected word line. In other words, the restorer formed by the switches $S1_m$ and $S2_m$ and the drive circuit (not shown) thereof is put into the test operating mode according to the invention by the interplay of the switches which leads to the restoring of the sensed cell information in the refresh operating mode being changed into the switch $S2_m$ being constantly held open and the switch $S1_m$ being constantly held closed. The generator G is set to a voltage $V_1$ which, in the event of writing to the cell, leads to the cell state that is predetermined for the test operating mode (for this purpose the generator G must, of course, be set correspondingly). If the voltage $V_1$=VL is set, a "0" is written to the cells; for $V_1$=VH a "1" is written. In the exemplary embodiments described further above where the cell state set at the beginning of the refresh test corresponds to a "0", $V_1$=VH is set.

We claim:

1. A method for testing a refresh device of an information memory having a multiplicity of cells, each cell having a minimum retention time and each cell storing information as a state of the respective cell, the refresh device refreshing the information before a guaranteed minimum retention time has elapsed, which comprises:

providing a refresh selector for selecting a cell to be refreshed from a multiplicity of cells, the selector having a refresh address counter with a counting range of N counts;

providing a sensor for sensing a state of each cell selected by the refresh selector;

providing a restorer for setting each selected cell into a fresh state when in a refresh operating mode, the restorer refreshing a number N of cell groups of the memory each addressable by the refresh counter and representing the information derived from the sensed state, and having a test operating mode;

verifying the respective states of each of the selected cells to produce a verified state for each cell;

setting the fresh state for each selected cell to a predetermined state differing perceptively from a previously verified state with the restorer operating in the test operating mode before the guaranteed minimum retention time has elapsed; and checking if the states of the selected cells set in the test operating mode of the restorer correspond to the predetermined states;

periodically emitting refresh clock pulses with a refresh clock for cyclically advancing the refresh address counter of the selector; and A) writing a known information item at the address of a chosen cell group within each of the N elements of the set which can be addressed by the refresh counter;

B) applying a number X of refresh clock pulses with X=N while the restorer is being operated in the test operating mode before the guaranteed minimum retention time has elapsed;

C) checking whether the states of the chosen cells set by the operation of the restorer correspond to the predetermined states after application of the X refresh clock pulses;

applying a number Y of refresh clock pulses while the restorer is being operated in the refresh operating mode, where it is a number other than an integer multiple of N; and repeating the steps A) to C).

2. The method according to claim 1, which further comprises:

writing a known information item to each selected cell during the verification.

3. The method according to claim 2, wherein the known information item forces all of the participating cells to assume the same state when the known information is written; and wherein the fresh state predetermined in the test operating mode of the restorer is identical for all of the participating cells.

4. The method according to claim 3, which further comprises:
defining possible states and the fresh state predetermined in the test operating mode of the restorer differs perceptively from the verified state, anywhere within the total range of possible states.

5. The method according to claim 1, wherein Y equals N/2.

6. The method according to claim 1, includes:
presetting a defined count with X<N at the refresh counter;
writing a known information item at the address of a chosen cell within each of the N;
applying a number X of refresh clock pulses to the chosen cell group with the restorer being operated in the test operating mode before the guaranteed minimum retention time has elapsed;
checking whether the states of the chosen cells set by the operation of the restorer corresponds to the predetermined states after the application of the X refresh clock pulses;
writing a known information item at the address of a chosen cell within each of the N elements of the set which can be addressed by the refresh counter;
applying a number N−X+1 of refresh clock pulses with the restorer being operated in the test operating mode before the guaranteed minimum retention time has elapsed; and
checking whether the states of the chosen cells set by the operation of the restorer corresponds to the predetermined states after the application of the N−X+1 refresh clock pulses.

7. The method according to claim 6, wherein X equals N−1.

8. The method according to claim 1, includes:
identifying instantaneously the existing count with X<N;
writing a known information item at the address of a chosen cell within each of the N elements of the set which can be addressed by the refresh counter;
applying a number X of refresh clock pulses to the chosen cell group with the restorer being operated in the test operating mode before the guaranteed minimum retention time has elapsed;
checking whether the states of the chosen cells set by the operation of the restorer corresponds to the predetermined states after the application of the X refresh clock pulses;
writing a known information item at the address of a chosen cell within each of the N cell groups;
applying a number N−X+1 of refresh clock pulses with the restorer being operated in the test operating mode before the guaranteed minimum retention time has elapsed; and
checking whether the states of the chosen cells set by the operation of the restorer corresponds to the predetermined states after the application of the N−X+1 refresh clock pulses.

9. The method according to claim 8, wherein X equals N−1.

10. The method according to claim 1, wherein an assigned amplifier reads the information stored in the cell; a signal source produces an output signal that leads to the information stored in the cell being read into the assigned sense amplifier; and the restorer contains a switch accessing the respectively selected cell in the refresh operating mode to allow the output signal of the signal source to become active at the cell, and then, once this signal has been decoupled, to couple the output of the sense amplifier to the cell for rewriting the information that was read;
and which further includes in the refresh operating mode:
setting the output signal of the signal source to a value that leads to the production of the cell state predetermined for the test operating mode when the selected cell is accessed; and
coupling the output signal of the signal source to the cell with the switch for the duration of the access, while decoupling the output of the sense amplifier from the cell.

* * * * *